United States Patent
Lee et al.

(10) Patent No.: US 8,796,819 B2
(45) Date of Patent: Aug. 5, 2014

(54) NON-VOLATILE MEMORY DEVICE INCLUDING A VARIABLE RESISTANCE MATERIAL

(75) Inventors: Eun-hong Lee, Yongin-si (KR); Choong-rae Cho, Yongin-si (KR); Stefanovich Genrikh, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1108 days.

(21) Appl. No.: 11/822,446

(22) Filed: Jul. 6, 2007

(65) Prior Publication Data
US 2008/0006907 A1    Jan. 10, 2008

(30) Foreign Application Priority Data
Jul. 6, 2006    (KR) .......................... 10-2006-0063502

(51) Int. Cl.
*H01L 29/12*    (2006.01)

(52) U.S. Cl.
USPC ................................... 257/613; 257/E45.003

(58) Field of Classification Search
USPC .................... 257/613, 314, E45.003
See application file for complete search history.

(56) References Cited

U.S. PATENT DOCUMENTS

| 5,512,773 | A | 4/1996 | Wolf et al. |
| 6,849,891 | B1* | 2/2005 | Hsu et al. ....................... 257/296 |
| 7,060,586 | B2 | 6/2006 | Li et al. |
| 2005/0247921 | A1* | 11/2005 | Lee et al. ........................... 257/2 |
| 2009/0065757 | A1 | 3/2009 | Sawa et al. |

FOREIGN PATENT DOCUMENTS

| CH | 1108816 | 9/1995 |
| WO | WO 2006/007525 A1 | 1/2006 |
| WO | WO 2006/101152 | 9/2006 |

OTHER PUBLICATIONS

Chinese Office Action dated Nov. 27, 2000, in corresponding Chinese Application No. 200700919035, with English translation.
Oct. 30, 2012 Japanese Office Action issued in Japanese Application No. 2007-178654 (with English translation).

* cited by examiner

*Primary Examiner* — Tucker Wright
(74) *Attorney, Agent, or Firm* — Harness, Dickey & Pierce, P.L.C.

(57) ABSTRACT

A non-volatile memory device including a variable resistance material is provided. The non-volatile memory device may include a buffer layer, a variable resistance material layer and/or an upper electrode, for example, sequentially formed on a lower electrode. A schottky barrier may be formed on an interface between the buffer layer and the lower electrode. The variable resistance material layer may be formed with a variable resistance property.

13 Claims, 4 Drawing Sheets

FIG. 4

| SCHOTTKY BARRIER HEIGHT (eV) | | | |
|---|---|---|---|
| | | Buffer Layer | |
| | | Copper (Cu) Oxide | Nickel (Ni) Oxide |
| Lower Electrode | Titanium (Ti) | -- | 0.55-1.45 |
| | Titanium Nitride (TiN) | 0.67-0.97 | 0.8 |
| | Cobalt (Co) | 0.5-1.16 | -- |
| | Tungsten (W) | 0.37-1.47 | -- |
| | Tantalum (Ta) | -- | 0.65-1.28 |
| | Tantalum Nitride (TaN) | -- | 0.7 |

NON-VOLATILE MEMORY DEVICE INCLUDING A VARIABLE RESISTANCE MATERIAL

PRIORITY STATEMENT

This application claims the benefit of priority under 35 U.S.C. §119 from Korean Patent Application No. 10-2006-0063502 filed on Jul. 6, 2006 in the Korean Intellectual Property Office, the disclosure of which is incorporated herein in its entirety by reference.

BACKGROUND

1. Field

Example embodiments relate to a non-volatile memory device. Other example embodiments relate to a variable resistance non-volatile memory device having a storage node-diode structure formed using a buffer layer and a variable resistance material layer. Example embodiments relate to a variable resistance non-volatile memory device having with a less complex structure, a more stable switching property and capable of operating without additional switching devices (e.g., a diode or a transistor).

2. Description of the Related Art

Generally, a semiconductor memory device includes a plurality of unit memory cells connected to each other using circuits. In a dynamic random access memory (DRAM), a unit memory cell generally includes a switch and a capacitor. The DRAM may be highly integrated and operate fast. If the power is turned off, then the data stored in the DRAM is deleted.

Non-volatile memory devices (e.g., flash memories) retain stored data after the power is turned off. Flash memories have a low integration degree. Flash memories operate slower than DRAMs.

In the field of non-volatile memory devices, research is being performed on Magnetic Random Access Memories (MRAMs), Ferroelectric Random Access Memories (FRAMs), Phase-change Random Access Memories (PRAMs) and Resistance Random Access Memories (RRAMs). MRAMs, FRAMs, PRAMs and RRAMs include a storage node storing data and a transistor or a diode for driving the storage node.

FIG. 1 is a diagram illustrating a cross-sectional view of a conventional RRAM device including a storage node having a conventional variable resistance material and a diode. RRAMs have a variable resistance characteristic wherein resistance varies according to voltage similar to a transition metal oxide.

In a conventional RRAM device, the variable resistance material may be a material having different resistances with respect to the same applied voltage (e.g., a transition metal oxide (TMO)). Some examples of TMOs include zinc oxide ($ZnO$), titanium oxide ($TiO_2$), niobium oxide ($Nb_2O_5$), zirconium oxide ($ZrO_2$) and nickel oxide ($NiO$).

Referring to FIG. 1, a diode structure 10 including an n-type oxide layer 12 and a p-type oxide layer 13 is formed on the lower electrode 11. A central electrode 14, a variable resistance material layer 16 and an upper electrode 17 are sequentially formed on the diode structure 10. A buffer layer 15 may be between the central electrode 14 and the variable resistance material layer 16.

Several deposition processes and etching processes are performed in order to form a cross-point array structure from the conventional memory device as shown in FIG. 1. As such, the fabrication process may be complex and/or may increase the size of the memory device, reducing the degree of integration the device.

SUMMARY

Example embodiments relate to a non-volatile memory device. Example embodiments relate to a non-volatile memory device. Other example embodiments relate to a variable resistance non-volatile memory device having a storage node-diode structure formed using a buffer layer and a variable resistance material layer. Example embodiments relate to a variable resistance non-volatile memory device having with a less complex structure, a more stable switching property and capable of operating without additional switching devices (e.g., a diode, a transistor, etc.).

According to example embodiments, there is provided a non-volatile memory device including a variable resistance material. The non-volatile memory device may include a lower electrode, a buffer layer formed on the lower electrode, a variable resistance material layer formed on the buffer layer and an upper electrode formed on the variable resistance material layer. The variable resistance material layer may have a variable resistance property.

A schottky barrier is formed on an interface between the buffer layer and the lower electrode. A height of the schottky barrier formed between the lower electrode and the buffer layer may range from 0.3 eV to 1.0 eV or from 0.5 eV to 1.0 eV.

The buffer layer and the variable resistance material layer may be formed of a p-type oxide material. The buffer layer may be formed of an nickel (Ni) oxide material or a copper (Cu) oxide material having a threshold switching property. The variable resistance material layer may be formed of a nickel (Ni) oxide material.

According to example embodiments, the buffer layer may be formed of a copper (Cu) oxide material and the lower electrode may be formed of one selected from the group consisting of titanium nitride ($TiN_x$), cobalt (Co) and tungsten (W).

According to other example embodiments, the buffer layer may be formed of a nickel (Ni) oxide material and the lower electrode may be formed of one selected from the group consisting of titanium (Ti), tantalum (Ta), tantalum nitride (TaN) and titanium nitride (TiN).

An ohmic contact structure may be formed between the variable resistance material layer and the upper electrode. A work function of the upper electrode may be larger than a work function of the variable resistance material layer.

BRIEF DESCRIPTION OF THE DRAWINGS

Example embodiments will be more clearly understood from the following detailed description taken in conjunction with the accompanying drawings. FIGS. 1-4 represent non-limiting, example embodiments as described herein.

FIG. 1 is a diagram illustrating a cross-sectional view of a conventional RRAM device including a storage node having a conventional variable resistance material and a diode;

FIG. 2 is a diagram illustrating a cross-sectional view of a non-volatile memory device having a variable resistance material according to example embodiments;

FIG. 4 is a graph showing the height of schottky barriers formed as a result of using various materials for a buffer layer and lower electrode in a non-volatile memory device having a variable resistance material according to example embodiments.

DETAILED DESCRIPTION OF EXAMPLE EMBODIMENTS

Figure 1:
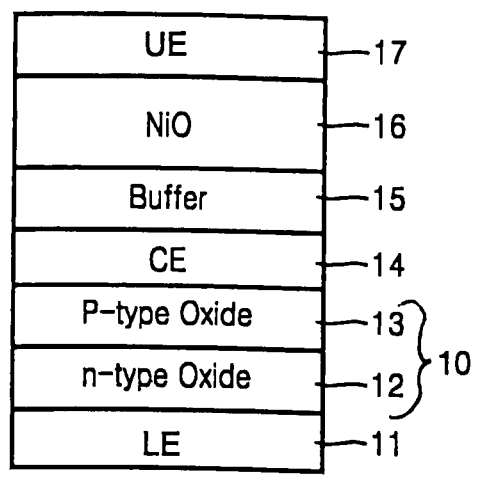

Various example embodiments will now be described more fully with reference to the accompanying drawings in which some example embodiments are shown. In the drawings, the thicknesses of layers and regions may be exaggerated for clarity.

Detailed illustrative embodiments are disclosed herein. However, specific structural and functional details disclosed herein are merely representative for purposes of describing example embodiments. This invention may, however, may be embodied in many alternate forms and should not be construed as limited to only the example embodiments set forth herein.

Accordingly, while the example embodiments are capable of various modifications and alternative forms, embodiments thereof are shown by way of example in the drawings and will herein be described in detail. It should be understood, however, that there is no intent to limit example embodiments to the particular forms disclosed, but on the contrary, the example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of the example embodiments.

Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various aspects will be described in detail with reference to the attached drawings. However, the present invention is not limited to the example embodiments described.

Example embodiments relate to a non-volatile memory device. Example embodiments relate to a non-volatile memory device. Other example embodiments relate to a variable resistance non-volatile memory device having a storage node-diode structure formed using a buffer layer and a variable resistance material layer. Example embodiments relate to a variable resistance non-volatile memory device having with a less complex structure, a more stable switching property and capable of operating without additional switching devices (e.g., a diode or a transistor).

Figure 2:
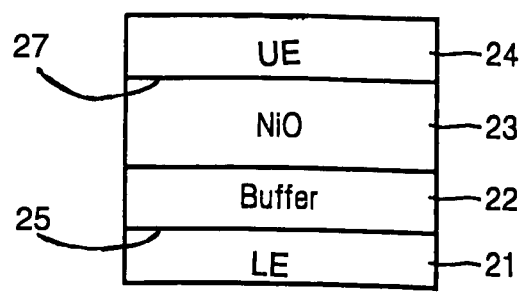

FIG. 2 is a diagram illustrating a cross-sectional view of a non-volatile memory device having a variable resistance material according to example embodiments.

Referring to FIG. 2, the non-volatile memory device including the variable resistance material includes a lower electrode 21, a buffer layer 22, a variable resistance material layer 23 and/or an upper electrode 24, for example, sequentially formed.

According to example embodiments, materials used to form the lower electrode 21 and the buffer layer 22 may be controlled (or selected) such that a schottky barrier structure is formed on an interface 25 between the lower electrode 21 and the buffer layer 22.

Materials used to form the variable resistance material layer 23 and the upper electrode 24 may be controlled (or selected) such that an ohmic contact structure is formed on an interface 27 between the variable resistance material layer 23 and the upper electrode 24.

Figure 3A:
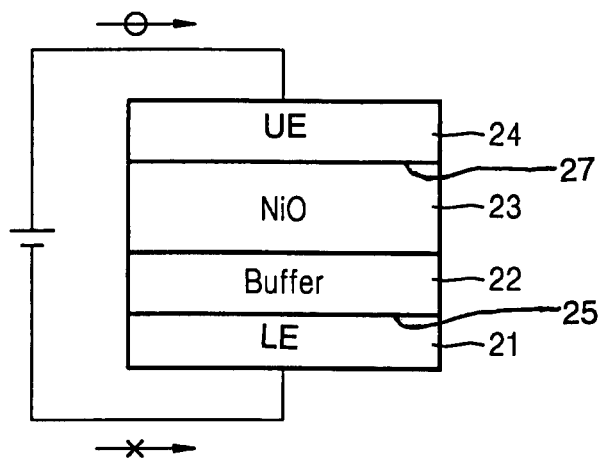
FIG. 3A is a diagram illustrating a flow of an electric current in a non-volatile memory device having a variable resistance material according to example embodiments.

FIG. 3A is a diagram illustrating a plan view illustrating a flow of an electric current in a non-volatile memory device having a variable resistance material according to example embodiments.

Hereinafter, materials used to form the layers in a non-volatile memory device having a variable resistance material according to example embodiments will be described in detail with reference to FIGS. 3A, 3B and 3C.

Figure 3B:
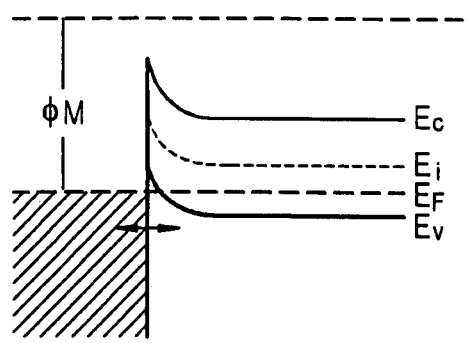
FIG. 3B is an energy band diagram of a non-volatile memory device having a variable resistance material with the ohmic contact structure formed on an interface between the variable resistance material layer and an upper electrode according to example embodiments.

FIG. 3B is an energy band diagram of a non-volatile memory device having a variable resistance material with an ohmic contact structure formed on an interface between a variable resistance material layer and an upper electrode according to example embodiments. FIG. 3B illustrates Fermi energy levels $E_F$, a lowest energy level of the conduction energy band $E_C$, an intrinsic energy level $E_i$, and a highest energy level of the valence energy band $E_v$.

Referring to FIGS. 3A and 3B, a work function of the upper electrode 24 may be larger than a work function of the variable resistance material layer, forming an ohmic contact structure on the interface 27 between the variable resistance material layer 23 and the upper electrode 24. According example embodiments, a p-type variable resistance material (e.g., nickel (Ni) oxide) may be used to form the variable resistance material layer 23. For example, if the variable resistance material layer 23 is formed of a p-type nickel oxide ($NiO_x$), then the upper electrode 24 may be formed of a precious metal (e.g., platinum (Pt) (5.34 work function)) having a larger work function than a work function of nickel oxide (NiO).

Figure 3C:
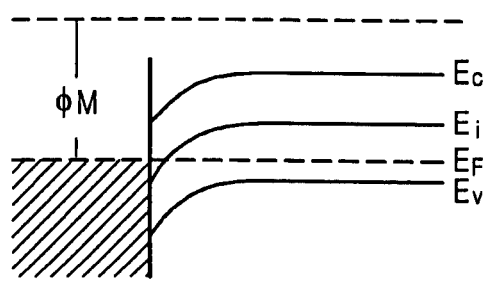
FIG. 3C is an energy band diagram of a non-volatile memory device having a variable resistance material with a schottky barrier formed on an interface between a lower electrode and a buffer layer according to example embodiments.

FIG. 3C is an energy band diagram of a non-volatile memory device having a variable resistance material with a schottky barrier structure formed on an interface between a lower electrode and a buffer layer according to example embodiments. FIG. 3C illustrates Fermi energy levels $E_F$, a lowest energy level of the conduction energy band $E_C$, an intrinsic energy level $E_i$, and a highest energy level of the valence energy band $E_v$.

Referring to FIGS. 3A and 3C, a schottky barrier may be formed on the interface 25 between the lower electrode 21 and a buffer layer 22 in a no-volatile memory device according example embodiments. In order to form the schottky barrier on the interface 25 between the lower electrode 21 and the buffer layer 22, the schottky barrier height ($F_B$) may range from 0.3 eV to 1.0 eV. In other example embodiments, $F_B$ may range from 0.5 eV to 1.0 eV.

If the variable resistance material layer 23 is formed of a p-type oxide material, then the buffer layer 22 may also be formed of a p-type oxide material. The buffer layer 22 may be formed of the same p-type oxide material as the variable resistance material layer. If the buffer layer 22 is formed of a n-type oxide material, then a p-n junction may form between the buffer layer 22 and the variable resistance material layer 23.

The schottky barrier height ($F_B$) is determined based on Equation (1) shown below:

$$F_B = E_g(\text{buffer layer}) + q\chi(\text{buffer layer}) - \Phi_M(\text{lower electrode}) \quad \text{EQUATION (1)}$$

where $E_g$ represents energy band gap, $q\chi$ represents electron affinity, and $\Phi_M$ represents work function.

According to example embodiments, the schottky barrier may be reduced to about ⅓ of the desired height due to $E_F$ (Fermi energy level) pinning caused by surface defects. Because the schottky barrier is formed between the lower electrode and the buffer layer, a current of $10^7$ A/cm² or more flows from the buffer layer to the lower electrode. A current of $10^{-2}$ A/cm² or less flows from the lower electrode to the buffer layer.

Materials suitable for forming the buffer layer 22 of a p-type oxide material and the schottky barrier height of 0.3 eV to 1.0 eV between the buffer layer 22 and the lower electrode 21 will now be discussed.

FIG. 4 is a graph showing the height of the schottky barrier formed as a result of using various materials for a buffer layer and lower electrode in a non-volatile memory device according to example embodiments.

Referring to FIG. 4, if the buffer layer 22 is formed of a p-type copper (Cu) oxide material, then the lower electrode 21 may be formed of titanium nitride ($TiN_x$), cobalt (Co) or tungsten (W). The schottky barrier height ranges from 0.67 eV to 0.97 eV if titanium nitride ($TiN_x$) is used to form the lower electrode 21. The schottky barrier height ranges from 0.5 eV to 1.16 eV if cobalt (Co) is used to form the lower electrode 21. The schottky barrier height ranges from 0.37 eV to 1.47 eV if tungsten (W) is used to form the lower electrode 21. Although the schottky barrier height may exceed a desired range, an average value of the schottky barrier height satisfies the conditions according to example embodiments.

If the buffer layer 22 is formed of a p-type nickel (Ni) oxide, then the lower electrode 21 may be formed of titanium (Ti), tantalum (Ta), tantalum nitride (TaN) or titanium nitride (TiN). The schottky barrier height ranges from 0.55 eV to 1.45 eV if titanium (Ti) is used to form the lower electrode 21. The schottky barrier height ranges from 0.65 eV to 1.28 eV if tantalum (Ta) is used to form the lower electrode 21. The schottky barrier height is 0.7 eV or larger if tantalum nitride (TaN) is used to form the lower electrode 21. The schottky barrier height is smaller than 0.8 eV if titanium nitride (TiN) is used to form the lower electrode 21.

The nickel (Ni) oxide material used to form the buffer layer 22 may be different from the nickel (Ni) oxide material used to form the variable resistance material layer 23. The variable resistance property of the nickel oxide ($NiO_x$) used to form the variable resistance material layer 23 is acquired by adjusting an oxygen tension within a range of about 5% to 10%. The nickel (Ni) oxide material used to form the buffer layer 22 is formed under an oxygen tension of 10% or higher to achieve a threshold switching property.

Figure 5:
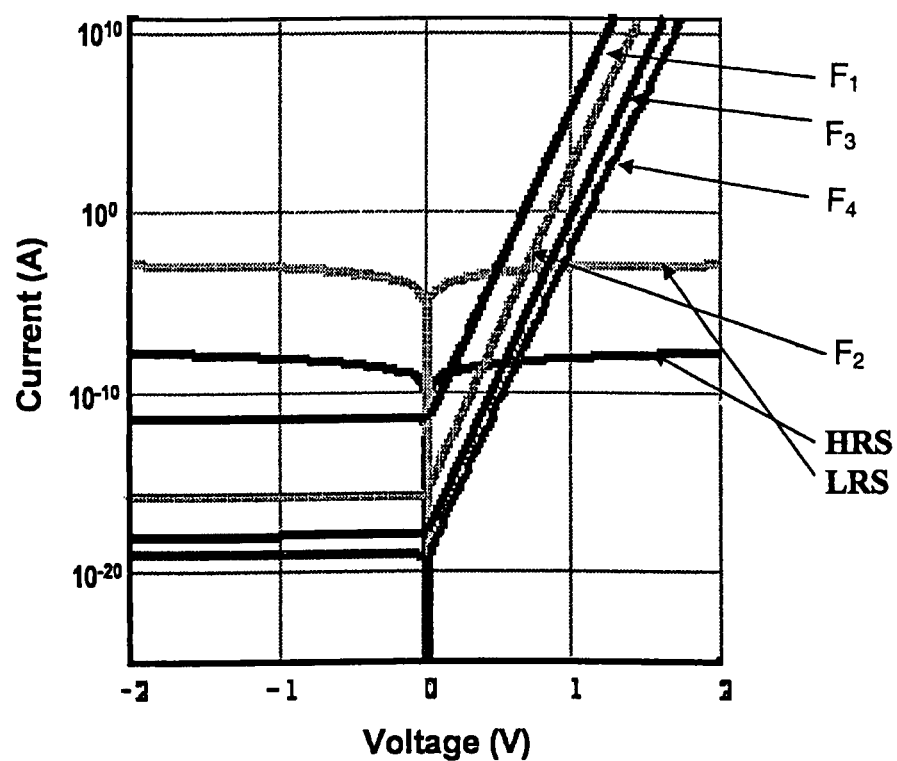
FIG. 5 is a graph showing the variation of electric current (I) and voltage (V) for a non-volatile memory device having a lower electrode formed of titanium nitride (TiN) and a buffer layer formed of copper oxide (CuO) according to example embodiments.

FIG. 5 is a graph illustrating an electric current (A) with respect to an applied voltage (V) in a non-volatile memory device having a variable resistance material including a lower electrode 21 formed of titanium nitride (TiN) and a buffer layer 22 formed of copper oxide (CuO) according to example embodiments.

Referring to FIG. 5, $F_1$ represents a schottky barrier height of 0.3 eV, $F_2$ represents a schottky barrier height of 0.5 eV, $F_3$ represents a schottky barrier height of 1.0 eV and $F_4$ represents a schottky barrier height of 1.5 eV. A schottky barrier height of 0.97 eV is located between $F_2$ and $F_3$. $F_1$, $F_3$ and $F_4$ are ideal schottky barrier heights. $F_2$ has a higher surface state density. $F_2$ is determined based on Equation (2) show below:

$$F_2 = E_g/3 \qquad \text{EQUATION (2)}$$

$H_{RS}$ represents a high resistance of $10^8$ ohms. $L_{RS}$ represents a low resistance of $10^3$ ohms.

If a negative voltage is applied, then the electric current barely flows. If a positive voltage is applied, then the current varies according to the applied voltage. As such, the schottky barrier height may perform a rectifying operation similar to a diode.

According to example embodiments, a schottky barrier formed between a lower electrode and a buffer layer may operate (or functional) as a conventional storage-node structure wherein a diode is formed under a variable resistance material layer. This structure may be formed using the conventional semiconductor processes. Fabrication processes according to example embodiments are easier. A size of the unit memory cell may be reduced.

According to example embodiments, a diode structure configured to perform a rectifying operation may formed on a lower electrode by forming a schottky barrier on an interface of the lower electrode, providing a variable resistance memory device having a less complex structure. The memory device may be formed easily in a cross-point type array and/or highly integrated.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A non-volatile memory device including a variable resistance material, the memory device comprising:
   a lower electrode;
   a buffer layer on the lower electrode, and a schottky barrier on an interface between the buffer layer and the lower electrode;
   a variable resistance material layer on the buffer layer, wherein the variable resistance material layer has a variable resistance property; and
   an upper electrode on the variable resistance material layer, wherein the non-volatile memory device operates without an additional switching device, and
   the lower electrode, the buffer layer, the variable resistance material layer and the upper electrode are in a stacked structure.

2. The memory device of claim 1, wherein the buffer layer and the variable resistance material layer are formed of a p-type oxide material.

3. The memory device of claim 1, wherein a work function of the upper electrode is larger than a work function of the variable resistance material layer.

4. The memory device of claim 1, wherein the variable resistance material layer is formed of a nickel (Ni) oxide material.

5. The memory device of claim 1, wherein the buffer layer is formed of an oxide material having a threshold switching property.

6. The memory device of claim 5, wherein buffer layer is formed of a nickel (Ni) oxide material having the threshold switching property.

7. The memory device of claim 1, wherein the additional switching device includes a diode or transistor.

8. The memory device of claim 1, wherein a height of the schottky barrier between the lower electrode and the buffer layer ranges from 0.3 eV to 1.0 eV.

9. The memory device of claim 8, wherein the buffer layer is formed of a nickel (Ni) oxide material and the lower electrode is formed of one selected from the group consisting of titanium (Ti), tantalum (Ta), tantalum nitride (TaN) and titanium nitride (TiN).

10. The memory device of claim 8, wherein the height of the schottky barrier ranges from 0.5 eV to 1.0 eV.

11. The memory device of claim 10, wherein the buffer layer is formed of a nickel (Ni) oxide material and the lower electrode is formed of one selected from the group consisting of titanium (Ti), tantalum (Ta), tantalum nitride (TaN) and titanium nitride (TiN).

12. The memory device of claim 1, wherein an ohmic contact structure is between the variable resistance material layer and the upper electrode.

13. The memory device of claim 12, wherein a work function of the upper electrode is larger than a work function of the variable resistance material layer.

* * * * *